United States Patent
Aigner et al.

(10) Patent No.: US 7,657,983 B2
(45) Date of Patent: Feb. 9, 2010

(54) METHOD OF PRODUCING A TOPOLOGY-OPTIMIZED ELECTRODE FOR A RESONATOR IN THIN-FILM TECHNOLOGY

(75) Inventors: Robert Aigner, Unterhaching (DE); Lüder Elbrecht, München (DE); Stephan Marksteiner, Putzbrunn (DE); Winfried Nessler, München (DE)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 681 days.

(21) Appl. No.: 10/888,429

(22) Filed: Jul. 9, 2004

(65) Prior Publication Data

US 2007/0209174 A1 Sep. 13, 2007

Related U.S. Application Data

(63) Continuation of application No. PCT/EP02/14190, filed on Dec. 12, 2002.

(30) Foreign Application Priority Data

Jan. 11, 2002 (DE) ................................. 102 00 741

(51) Int. Cl.
H03H 3/02 (2006.01)
(52) U.S. Cl. .................. 29/25.35; 29/846; 216/38; 310/313 R; 310/348; 310/365
(58) Field of Classification Search ............... 29/25.35, 29/594, 846, 831; 216/38, 88–91, 57; 310/345, 310/348, 365, 366, 313 A, 313 B, 313 R, 310/322

See application file for complete search history.

(56) References Cited

U.S. PATENT DOCUMENTS

| | | | |
|---|---|---|---|
| 5,618,381 A | 4/1997 | Doan et al. | |
| 5,647,932 A | 7/1997 | Taguchi et al. | |
| 5,683,938 A | 11/1997 | Kim et al. | |
| 5,771,555 A | 6/1998 | Eda et al. | |
| 5,801,069 A * | 9/1998 | Harada et al. | 438/52 |
| 6,013,926 A * | 1/2000 | Oku et al. | 257/284 |
| 6,420,202 B1 | 7/2002 | Barber et al. | |
| 6,441,539 B1 * | 8/2002 | Kitamura et al. | 310/346 |
| 6,496,085 B2 * | 12/2002 | Ella et al. | 333/189 |
| 6,509,813 B2 * | 1/2003 | Ella et al. | 333/187 |
| 6,542,054 B2 | 4/2003 | Aigner et al. | |
| 2001/0021594 A1 | 9/2001 | Yoo | |
| 2002/0022292 A1 | 2/2002 | Barber et al. | |
| 2002/0154425 A1 | 10/2002 | Aigner et al. | |

FOREIGN PATENT DOCUMENTS

| | | |
|---|---|---|
| EP | 0206444 | 1/1986 |
| EP | 1156584 A1 | 11/2001 |

(Continued)

OTHER PUBLICATIONS

Machine Translation of JP2000340542.*

*Primary Examiner*—A. Dexter Tugbang
*Assistant Examiner*—Livius R Cazan

(57) ABSTRACT

In a method of producing an electrode for a resonator in thin-film technology, the electrode of the resonator is embedded in an insulating layer such that a surface of the electrode is exposed, and that a surface defined by the electrode and the insulating layer is substantially planar.

20 Claims, 4 Drawing Sheets

FOREIGN PATENT DOCUMENTS

| | | |
|---|---|---|
| JP | 53-040278 | 4/1978 |
| JP | 60-016010 | 1/1985 |
| JP | 61-193454 | 8/1986 |
| JP | 2000340542 A * | 12/2000 |
| WO | WO 01/24361 A1 | 4/2001 |

* cited by examiner

METHOD OF PRODUCING A TOPOLOGY-OPTIMIZED ELECTRODE FOR A RESONATOR IN THIN-FILM TECHNOLOGY

CROSS-REFERENCE TO RELATED APPLICATION

This application is a continuation of copending International Application No. PCT/EP02/14190, filed Dec. 12, 2002, which designated the United States, Japan and Korea and was not published in English.

BACKGROUND OF THE INVENTION

1. Field of the Invention

The present invention relates to a method of producing an electrode for a resonator in thin-film technology, in particular to a method of producing a resonator which includes a piezoelectric layer arranged at least partly between a lower electrode and an upper electrode, and here relates, in particular, to the production of a BAW resonator (BAW=bulk acoustic wave).

2. Description of Prior Art

In the production of frequency filters in thin-film technology using thin-layer bulk acoustic resonators (FBAR=film bulk acoustic resonator), which are also referred to as BAW resonators, the piezoelectric layer, e.g. an AlN layer, a ZnO layer, or PZT layer, is typically deposited by means of a reactive sputtering process. The reactive sputtering process is preferred because it requires a relatively low process temperature and offers deposition conditions which are easy to control and reproduce. In addition, the reactive sputtering process leads to a high-quality thin layer.

A problem associated with producing the thin layers arises due to the specific growth conditions of piezoelectric layers, in which crystallites having a certain preferred orientation grow faster than those with other orientations. In combination with the poor edge coverage of a sputtering process, these specific growth conditions of the piezoelectric layers lead to the formation of growth defects at the topology steps.

These growth defects will be explained below in more detail with reference to FIG. 1. FIG. 1A shows an arrangement which includes a substrate 100 comprising a first, lower surface 102 as well as a second, upper surface 104. A first, lower electrode 106 is formed in a portion on the upper surface 104, which electrode 106 in turn includes a first, lower surface 108 as well as a second, upper surface 110. By means of the above-mentioned sputtering process, a piezoelectric layer 112, which is an AlN layer in the example depicted, has been produced on that portion of the upper surface 104 of substrate 100 which is not covered by the electrode 106 as well as on the upper surface 110 of electrode 106.

As may be seen from FIG. 1A, due to the arrangement of electrode 106 on surface 104 of substrate 100, a step 114 (topology step) is formed whereat a growth defect occurs during a sputtering process due to the poor edge coverage of the sputtering process and due to the specific growth conditions of the piezoelectric layer 112, which growth defect is generally indicated by reference numeral 116 in FIG. 1A. By reference numeral 118, FIG. 1A depicts a preferred direction of growth of the piezoelectric layer in the various areas. In the area of step 114, these lines 118 may be seen to be offset, which has led to the occurrence of the growth defect 116. The lines of offset and the defects resulting therefrom are undesirable for the reasons stated below and lead to problems regarding the reliability of the device to be produced, in particular in connection with the subsequent deposition of an upper electrode.

Specifically, in a subsequent deposition and structuring of a metallization for producing the upper electrode, a metallic spacer will remain which may subsequently lead to electrical short-circuits, whereby the functionality of the device, e.g. a filter, may be degraded or completely destroyed. FIG. 1B represents the structure which results, starting from FIG. 1A, once a metallization which has been subjected to full-area deposition, has been structured for producing an upper electrode. FIG. 1B shows a second, upper electrode 120 formed on a surface 122 of the piezoelectric layer 112 which is facing away from substrate 100, such that this upper electrode 120 is at least partly opposite the electrode 106. The thin-layer bulk acoustic resonator is formed in that area in which electrode 106 and upper electrode 120 overlap. As may also be seen in FIG. 1B, a rest of metal 124 (metal spacer) has remained in the area of the growth defect 116. This metal spacer 124 leads to the above-mentioned problems in connection with electric short-circuits and the like.

A further disadvantage of the structure described in FIG. 1 is that for suppressing undesired spurious modes, a concept is usually applied wherein an area outside the upper electrode 120 has, across a width of several micrometers, a defined geometry, i.e. a defined thickness. As may be seen in FIGS. 1A and 1B, this may only be achieved if the upper electrode 120 is configured to be clearly smaller than electrode 106, so that hereby an increase in the size of the structure is required for suppressing the undesired spurious modes, which increases the overall size of the structure. In addition, this significantly degrades the behavior of the resulting resonator device with regard to bandwidth and parasitic capacitances.

Another problem arising in connection with the production method described with regard to FIG. 1 is that a weak point of the piezoelectric layer exists in those areas in which the upper electrode 120 traverses the growth defects, which is always necessary, the weak point being related to a dielectric breakdown. Due to the growth defect 116 (void-defect) the desired ESD resistance (ESD=electrostatic discharge) which would be expected in a fully planar arrangement therefore cannot be achieved.

The method described with regard to FIG. 1A and, in particular, the problems in the prior art associated therewith have, in principle, not been discussed so far. In principle, the metal spacer 124 may be reduced by a pronounced over-etching in structuring the upper electrode 120. Due to the significant overhang of the piezoelectric layer 112, the metal spacer can still not be fully removed despite etching. The removal can only be achieved by subjecting the upper electrode to further isotropic etching, e.g. wet-etching. The disadvantage of this approach, however, is that due to an underetching of the resist mask, which is hard to control, the resulting electrode edge is poorly adjusted in relation to other layers, which, again, leads to a deterioration of the spurious mode behavior.

It shall be pointed out here that substrate 100, in turn, may typically consist of a sequence of several layers. These layers, for their part, may be structured and thus contribute themselves to the creation of topology steps. A typical example is a so called acoustic mirror, i.e. a sequence of layers having high and low acoustic impedances. For simplifying the representation in FIG. 1, these details have been dispensed with, and substrate 100 has been drawn as a homogeneous block.

SUMMARY OF THE INVENTION

It is the object of the present invention to provide an improved method of producing a topology-optimized electrode for a resonator in thin-film technology, which method avoids the occurrence of growth defects in producing the piezoelectric layer and the problems associated therewith.

The present invention provides a method of producing a resonator in thin-film technology, the resonator including a piezoelectric layer which is arranged at least partially between a lower electrode and an upper electrode, the resonator being formed on a substrate, the method including:

(a) producing the lower electrode of the resonator on the substrate;

(b) depositing an insulating layer on the surface of the substrate, with a thickness substantially equal to the thickness of the electrode;

(c) lifting off the insulating layer such that a surface of the lower electrode is exposed, and that a surface defined by the lower electrode and the insulating layer is substantially planar;

(d) producing the piezoelectric layer on the structure resulting from step (c); and (e) producing the upper electrode on the piezoelectric layer.

In accordance with the present invention, provision is made of a manufacturing method for the electrode for resonators in thin-film technology, e.g. BAW resonators, in which resonators the above-mentioned disadvantages existing in the prior art are avoided by avoiding the undesired topology step of the electrode. To this end, areas present outside of the electrode are filled with a dielectric layer, e.g. silicon oxide or silicon nitride, up to the level of the upper edge of the electrode. The advantage of the present invention is that this may be achieved in a manner which is particularly simple from a technical point of view.

To this end, in accordance with a first preferred embodiment, the dielectric layer is at first deposited, with a thickness roughly corresponding to the topology step, onto an entire surface of a substrate/wafer on which the electrode has already been formed. Subsequently, the insulating layer is lifted off, by chemical-mechanical polishing, such that an upper surface of the electrode is exposed, the lifting-off being effected such that the thicknesses of the insulating layer and of the lower electrode are substantially identical. The characteristic lift-off behavior of the chemical-mechanical polishing here effects that only those areas of the insulating material are removed which are located above the electrode.

In accordance with another embodiment, the insulating layer is initially produced as was explained above. Subsequently, however, that part of the insulating material which lies on the electrode is etched off by means of a resist mask. Due to adjustment tolerances in lithography it is necessary for the etching opening in the resist to be smaller than the electrode, since otherwise the topology step might be exposed again in the etching process. The etching process may comprise both wet-chemical and dry etching (plasma etching). As a result, a "collar" of the insulating material will remain on the electrode. This collar is subsequently removed by chemical-mechanical polishing, so that an substantially planar surface results.

In accordance with another embodiment, the insulating layer is initially produced, and subsequently an opening is formed therein, in which the metal for the electrode is then deposited, such that the resulting surfaces of the insulating layer and the electrode are substantially flush.

BRIEF DESCRIPTION OF THE DRAWINGS

Preferred embodiments of the present invention will be explained in more detail below with reference to the accompanying figures, wherein.

DESCRIPTION OF PREFERRED EMBODIMENTS

Figure 1A:
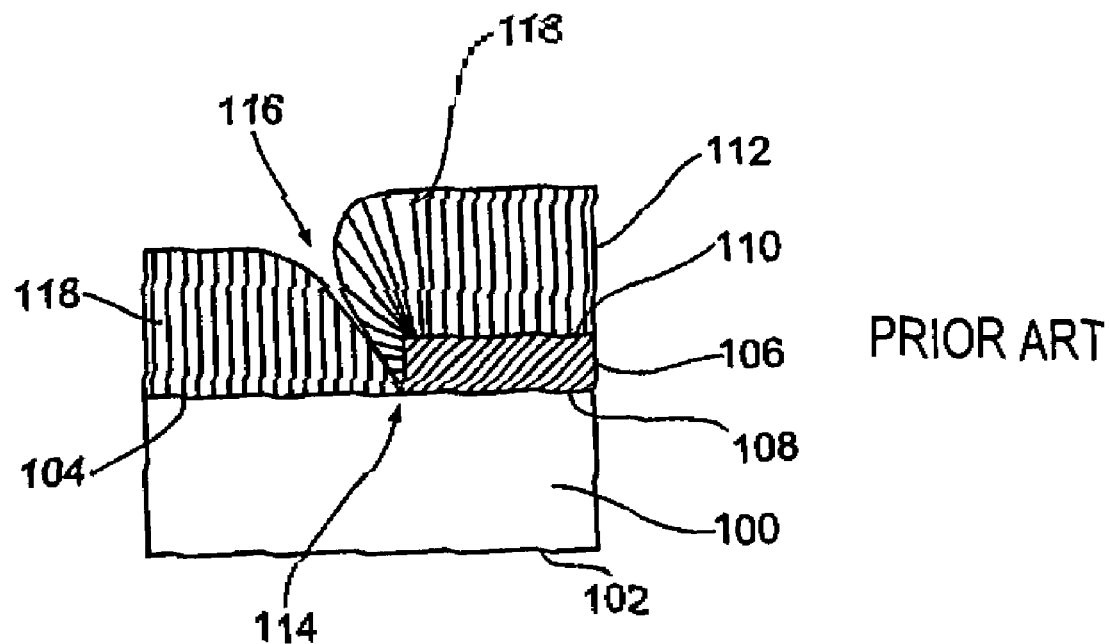
FIGS. 1A and 1B depict a known method of producing a BAW resonator wherein a growth defect results due to a topology step.
Figure 1B:
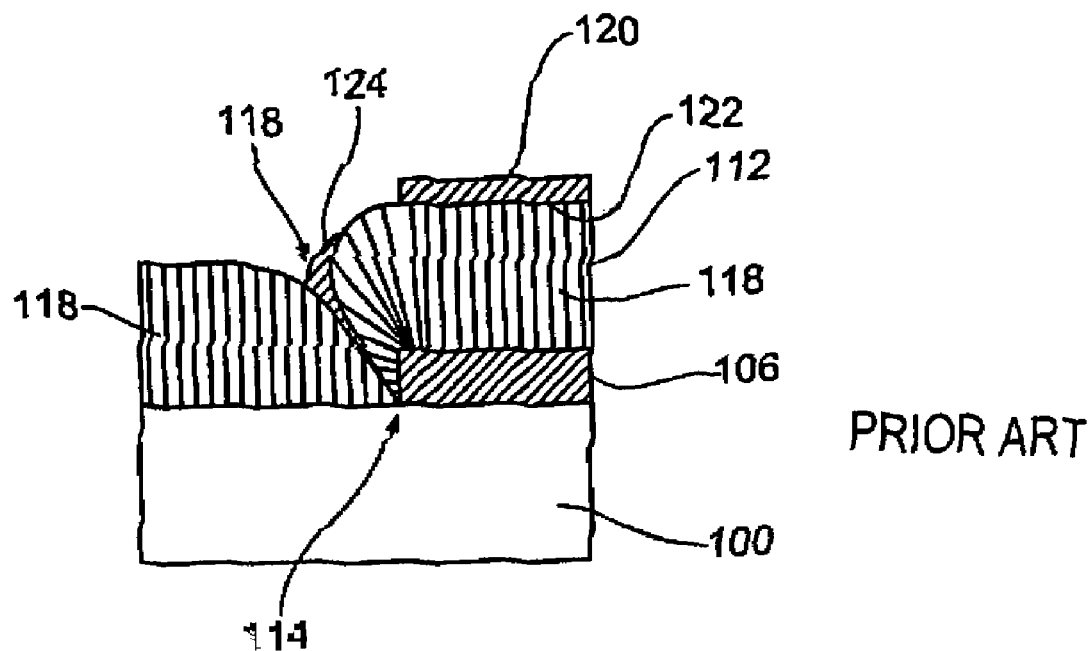

In the following description of the preferred embodiments of the present invention, identical reference numerals will be used for elements that have already been explained and described with reference to FIG. 1.

Figure 2A:
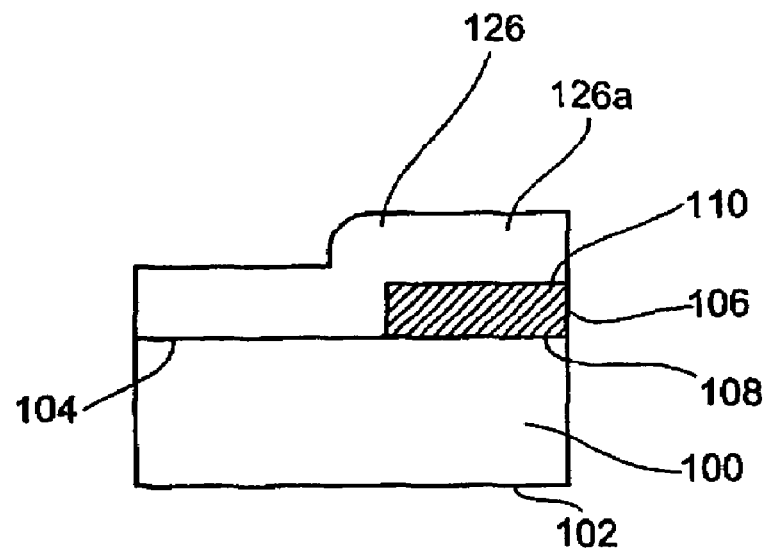
FIGS. 2A to 2C depict a first embodiment of the inventive production method.

FIG. 2A shows substrate 100, an electrode 106, preferably made of aluminum, being formed on a portion of the upper surface 104 of substrate 100. Alternatively, electrode 106 may also be formed of tungsten, a combination of aluminum and tungsten, or other suitable metals.

To avoid the topology step, an insulating layer 126 is deposited, in accordance with the embodiment described with regard to FIG. 2A, onto the exposed portion of the substrate surface 104 as well as onto the upper surface 110 of electrode 106. In the embodiment depicted, the insulating layer 126 is a layer of silicon oxide or a layer of silicon nitride.

Figure 2B:
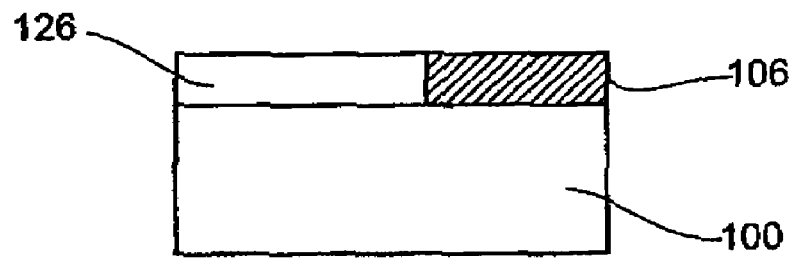

The structure depicted in FIG. 2A is subsequently subjected to a chemical-mechanical thinning process, by means of which a portion 126a, arranged in the area of electrode 106, is thinned such that the upper surface 110 of electrode 106 is exposed. In addition, the remaining portions of the insulating layer 126 are thinned such that the thickness of the electrode 106 and the thickness of the insulating layer 126 are substantially identical, so that an substantially planar surface results, as is shown in FIG. 2B.

Figure 2C:
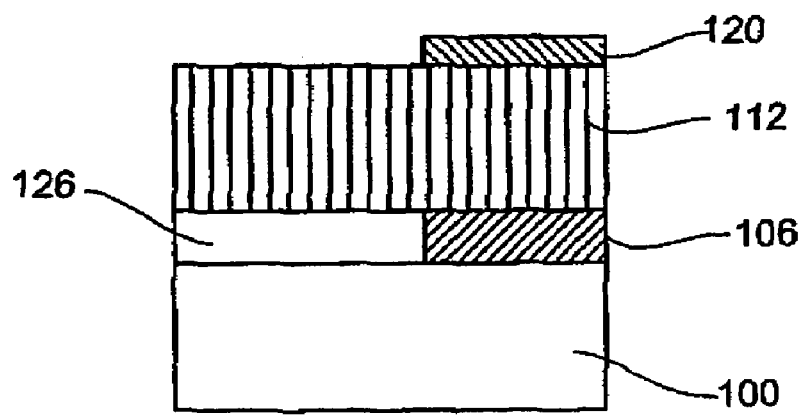

FIG. 2C depicts the structure resulting from the polishing step, and, as may be seen, those surfaces of the insulating layer 126 and of the electrode 106 which are facing away from the substrate are substantially planar, and this surface has the piezoelectric layer 112 deposited thereon, which, in turn, has the upper electrode 120 deposited thereon.

The advantage of the inventive method is evident, since the problems due to growth defects which have been described and are known in the prior art are avoided simply by eliminating a topology step in the production of the resonator. This has the advantage that the electrical short-circuits mentioned, which may degrade or even destroy the function of the device (e.g. a filter including corresponding resonators) will not occur, that a desired ESD resistance is achieved due to the substantially fully planar arrangement, and that the suppression of undesired spurious modes is improved, since a defined geometry (thickness) exists in the area outside of the upper electrode 120 across a wide area.

The above-described removal of the dielectric layer 126A above the electrode 106 is effected, in the embodiment depicted in FIG. 2, directly with a very hard polishing pad. In this case it is necessary to have a high polishing selectivity between the dielectric layer 126 and the material of the electrode 106 to ensure that when reaching the upper surface 110 of the electrode 106, substantially no electrode material will be lifted off.

In order to avoid potential problems in the required high polishing selectivity between the dielectric layer 126 and the material of the electrode 106, another approach is pursued, in accordance with a second embodiment of the present invention, which imposes clearly fewer requirements with regard to the hardness of the pad and/or the selectivity of the polishing process. This further embodiment will be explained below in more detail with reference to FIG. 3, identical or similar elements also being given the same reference numerals.

The embodiment depicted in FIG. 3 is based on a structure as is represented in FIG. 2A, i.e. a structure wherein the electrode 106 has already been deposited on substrate 100, and the insulating layer 126 has already been deposited on the electrode 106.

Figure 3A:
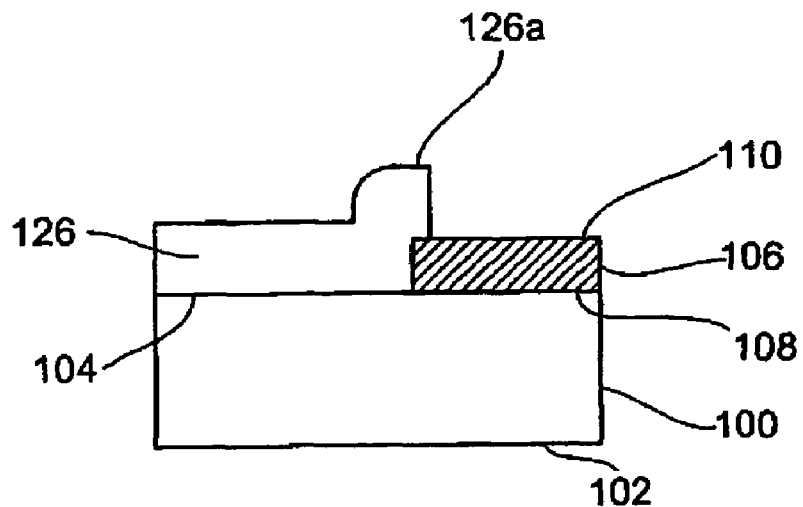
FIGS. 3A to 3C depict a second embodiment of the inventive production method.
Figure 3B:
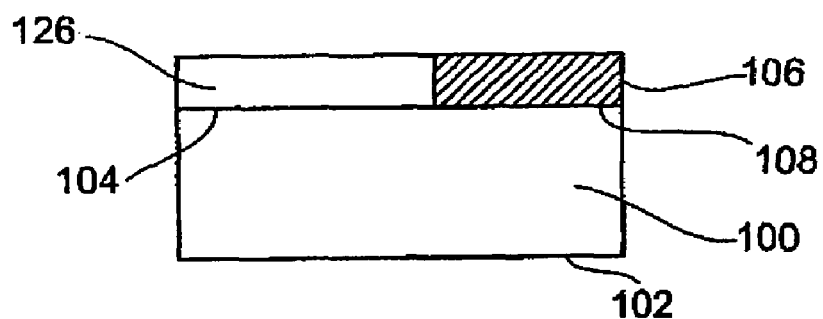

Unlike the embodiment described in FIG. 2, chemical-mechanical polishing of the entire surface is not performed here, but, instead, the dielectric layer 126 is removed in the area within the electrode 106, e.g. by etching the dielectric layer 126, using a photolithographic mask (not depicted), so as to expose the upper surface 110 of electrode 106 at least partially, as is shown in FIG. 3A. As may be seen, a narrow ridge 126A of the portion of the insulating layer 126 above the electrode 106 has remained. The advantage of this approach is that now only the narrow ridge 126A remains, which, contrary to the distance or polishing of the entire layer 126, may be removed within a very short time and under clearly relaxed polishing conditions, so that the structure shown in FIG. 3B results.

Figure 3C:
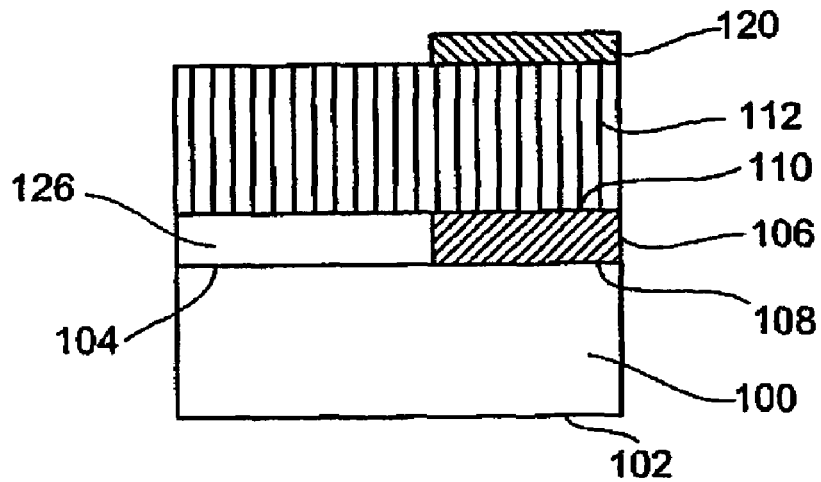

FIG. 3C depicts the structure resulting after the polishing and the growing of the piezoelectric layer 114 as well as of the upper electrode 120, and the structure shown in FIG. 3C corresponds to the structure depicted in FIG. 2C. The advantage of the approach described in FIG. 3 is that, with this embodiment, which uses the additional mask and the etching of the dielectric layer 126, the undesired topology step may be prevented in a manner which is particularly simple from a technical point of view.

Another embodiment not shown in the figures consists in that on the surface of the substrate 100, the dielectric layer 126 is initially deposited, wherein an opening, preferably down to the substrate surface 104, is opened in a subsequent step, in which opening the metal of the bottom electrode 106 is then deposited, such that the surfaces of the dielectric layer 126 and of the bottom electrode 106 created are substantially flush.

Figure 4:
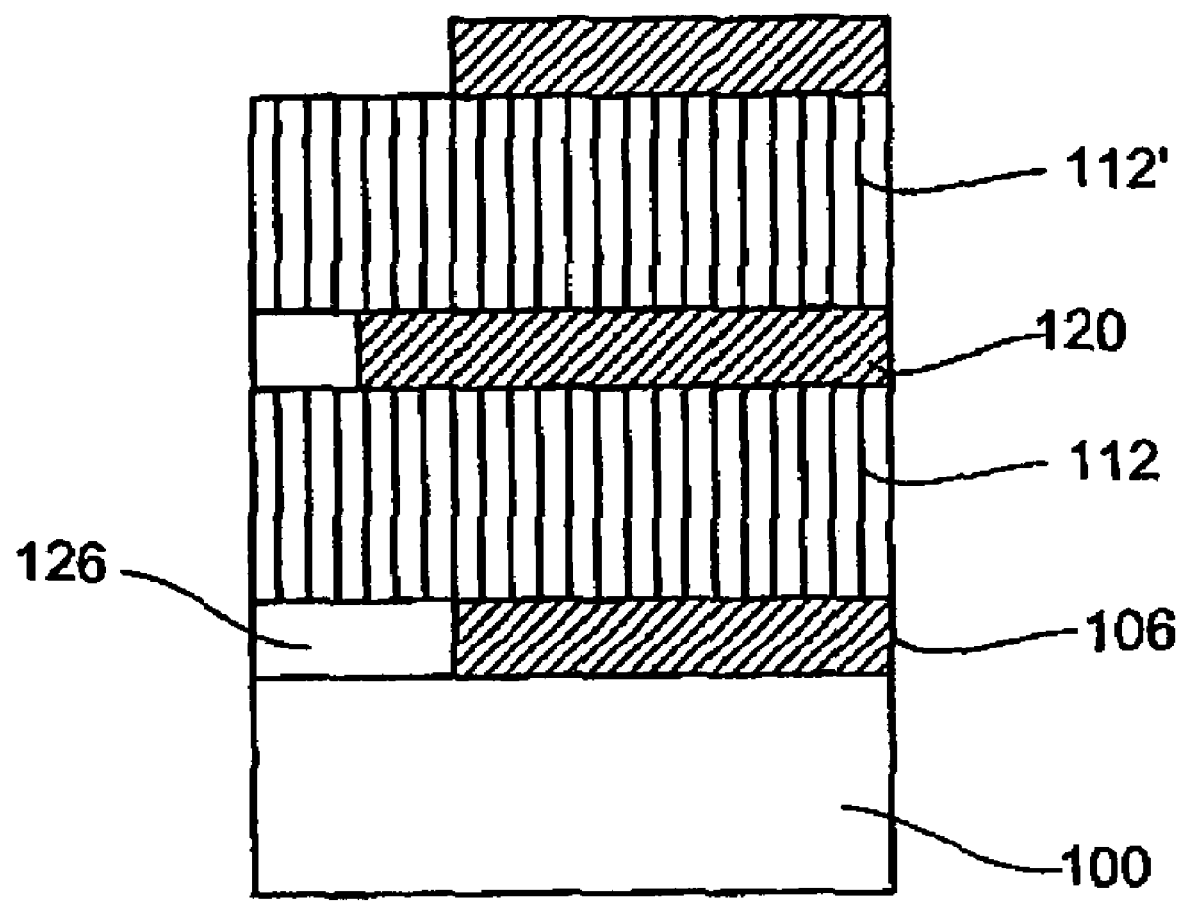
FIG. 4 depicts a third embodiment of the inventive production method in a stacked resonator arrangement.

The above-described method of producing an electrode without topology step may also be used for so-called stacked BAW resonators/filters having a plurality of piezoelectric layers. FIG. 4 depicts such a resonator. As may be seen, the inventive method of producing the electrode was both applied to the bottom electrode 106 and to the intermediate electrode 120. Thus, both piezoelectric layers 112, 112' may be deposited without lines of offset. Embodiments having more than two piezolayers may be produced by analogy therewith.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A method of producing a resonator in thin-film technology, the resonator including a piezoelectric layer which is arranged at least partially between a lower electrode and an upper electrode, the resonator being formed on a substrate, the method comprising:
   (a) producing the lower electrode of the resonator on the substrate;
   (b) depositing an insulating layer on the surface of the substrate, with a thickness substantially equal to the thickness of the lower electrode;
   (c) lifting off a portion of the insulating layer such that a surface of the lower electrode is exposed, and that a substantially planar surface defined by the lower electrode and a portion of insulating layer remaining is formed;
   (d) depositing the piezoelectric layer on and in contact with the substantially planar surface; and
   (e) producing the upper electrode on the piezoelectric layer.

2. The method as claimed in claim 1, wherein the lifting off comprises lifting off the insulating layer such that a portion of the insulating layer outside of the lower electrode remains substantially unchanged.

3. The method as claimed in claim 2, wherein the lifting off comprises the removal of the insulating layer above the lower electrode by chemical-mechanical polishing.

4. The method as claimed in claim 1, wherein the lifting off comprises: etching a part of the insulating layer above the lower electrode using a mask, such that a portion of the upper surface of the lower electrode is exposed; and removing, using chemical-mechanical polishing, remaining portions of the insulating layer that are located above a plane defined by the surface of the lower electrode.

5. The method as claimed in claim 1, wherein the insulating layer comprises a dielectric layer.

6. The method as claimed in claim 5, wherein the dielectric layer comprises one of the group consisting of a silicon nitride layer and a silicon oxide layer.

7. The method as claimed in claim 1, wherein the piezoelectric layer comprises one of the group consisting of AlN, ZnO and PZT.

8. The method as claimed in claim 1, wherein the lower electrode and the upper electrode comprise at least one of the group consisting of aluminum and tungsten.

9. The method as claimed in claim 1, wherein the resonator is a BAW resonator.

10. A method of producing a resonator in thin-film technology, the resonator including a piezoelectric layer which is arranged at least partially between a first electrode and a second electrode, the resonator being formed on a substrate, the method comprising:
   (a) providing the first electrode of the resonator on the substrate;
   (b) forming an insulating layer on the surface of the substrate, the insulating layer having a thickness at least as great as a thickness of the first electrode;
   (c) removing a portion of the insulating layer such that a surface of the first electrode is exposed, and that a substantially planar surface defined by the first electrode and the insulating layer is formed;
   (d) depositing the piezoelectric layer on and in contact with the substantially planar surface; and (e) producing the second electrode on the piezoelectric layer.

11. The method as claimed in claim 10, wherein the forming the insulating layer comprises depositing the insulating layer.

12. The method as claimed in claim 10, wherein the removing comprises removing the insulating layer such that a portion of the insulating layer outside of the first electrode remains substantially unchanged.

13. The method as claimed in claim 12, wherein the removing comprises the removal of the insulating layer above the electrode by chemical-mechanical polishing.

14. The method as claimed in claim 10, wherein removing comprises: etching a part of the insulating layer above the first electrode using a mask, such that a portion of the upper surface of the first electrode is exposed; and removing, using chemical-mechanical polishing, remaining portions of the insulating layer that are located above a plane defined by the surface of the first electrode.

15. The method as claimed in claim 10, wherein the insulating layer comprises a dielectric layer.

16. The method as claimed in claim 15, wherein the dielectric layer comprises one of the group consisting of a silicon nitride layer and a silicon oxide layer.

17. The method as claimed in claim 16, wherein the piezoelectric layer comprises one of the group consisting of AlN, ZnO and PZT.

18. The method as claimed in claim 10, wherein the first electrode and the second electrode comprise at least one of the group consisting of aluminum and tungsten.

19. The method as claimed in claim 10, wherein the resonator is a BAW resonator.

20. The method as claimed in claim 10, wherein the piezoelectric layer comprises one of the group consisting of AlN, ZnO and PZT.

* * * * *